United States Patent
Sievenpiper et al.

(10) Patent No.: US 9,893,217 B2
(45) Date of Patent: **\*Feb. 13, 2018**

(54) RADIO FREQUENCY TRANSPARENT PHOTOVOLTAIC CELL

(71) Applicant: Raytheon Company, Waltham, MA (US)

(72) Inventors: Daniel F. Sievenpiper, San Diego, CA (US); Michael Wechsberg, Santa Ana, CA (US); Fangchou Yang, Los Angeles, CA (US)

(73) Assignee: RAYTHEON COMPANY, Waltham, MA (US)

( * ) Notice: Subject to any disclaimer, the term of this patent is extended or adjusted under 35 U.S.C. 154(b) by 640 days.

This patent is subject to a terminal disclaimer.

(21) Appl. No.: 14/460,298

(22) Filed: Aug. 14, 2014

(65) Prior Publication Data
US 2014/0352755 A1    Dec. 4, 2014

Related U.S. Application Data

(62) Division of application No. 12/661,859, filed on Mar. 25, 2010, now Pat. No. 8,853,528.

(51) Int. Cl.
*H01L 31/00* (2006.01)
*H01L 31/0224* (2006.01)
(Continued)

(52) U.S. Cl.
CPC .. *H01L 31/022441* (2013.01); *H01L 31/0224* (2013.01); *H01L 31/022425* (2013.01);
(Continued)

(58) Field of Classification Search
CPC ......... H01L 31/022425; H01L 31/0224; H01L 31/022441; H01L 31/042; H01Q 15/0013; H01Q 15/00131; Y02E 10/50
(Continued)

(56) References Cited

U.S. PATENT DOCUMENTS 4,090,359 A    5/1978    Doellner
4,487,989 A    12/1984    Wakefield et al.
(Continued)

FOREIGN PATENT DOCUMENTS

JP    4-348570 A    12/1992

OTHER PUBLICATIONS

Kuendig et al., "Thin film solar cells for space applications: Radiation hardness and applications for an integrated solant (solar cell-antenna) module", IEEE 2000.*
(Continued)

*Primary Examiner* — Matthew Martin
(74) *Attorney, Agent, or Firm* — Lewis Roca Rothgerber Christie LLP

(57) ABSTRACT

A radio frequency transparent photovoltaic cell includes a back contact layer formed of an electrically conductive material, at least one aperture formed in the back contact layer, and at least one photovoltaic cell section disposed on the back contact layer. An airship includes one or more radio frequency antennas disposed in an interior of the airship. One or more radio frequency transparent photovoltaic cells are disposed on an outer surface of the airship.

11 Claims, 11 Drawing Sheets

(51) Int. Cl.
*H01Q 1/44* (2006.01)
*H01Q 1/12* (2006.01)
*H01Q 15/00* (2006.01)
*H01L 31/042* (2014.01)
*H01L 31/18* (2006.01)

(52) U.S. Cl.
CPC ............ *H01L 31/042* (2013.01); *H01L 31/18* (2013.01); *H01Q 1/1292* (2013.01); *H01Q 1/44* (2013.01); *H01Q 15/0013* (2013.01); *Y02E 10/50* (2013.01)

(58) Field of Classification Search
USPC ........................................................ 136/256
See application file for complete search history.

(56) References Cited

U.S. PATENT DOCUMENTS

| | | | |
|---|---|---|---|
| 4,663,495 A | | 5/1987 | Berman et al. |
| 4,795,500 A | | 1/1989 | Kishi et al. |
| 5,208,603 A | * | 5/1993 | Yee ........................ H01Q 1/286 343/872 |
| 5,377,037 A | | 12/1994 | Branz et al. |
| 5,482,570 A | | 1/1996 | Saurer et al. |
| 5,917,458 A | | 6/1999 | Ho et al. |
| 6,858,461 B2 | | 2/2005 | Oswald et al. |
| 7,982,127 B2 | | 7/2011 | Wu et al. |
| 8,853,528 B2 | | 10/2014 | Sievenpiper et al. |
| 2004/0219801 A1 | | 11/2004 | Oswald et al. |

OTHER PUBLICATIONS

Extended EP Search Report Application No. 11159586.4 dated Jun. 9, 2015, 9 pages.

Roo-Ons, M.J., On Bifacial Solar Cell Transparency at Radio Frequencies, The Compiled State-of-the-Art of PV Solar Technology and Deployment, 24th European Photovoltaic Solar Energy Conference and Exhibition; Conference 21-25, Sep. 2009, Exhibition 21-24, Sep. 2009, Hamburg; Proceedings; EU PVSEC, WIP-RENE, XP040530645, ISBN; 978-3-936338-25-6, 4 pages.

Kagan, M., et al., The Combined Photovoltaic Converters Based on Gallium Arsenide for Space Application, Conference Record of the 25th, IEEE Photovoltaic Specialists Conference 1996, May 13-17, 1996, [Conference Record of theIEEE Photovoltaic Specialists Conference], New York, IEEE, US, vol. Conf. 25, No. Conf. 25, XP000896897, ISBN: 978-0-7803-3167-9, pp. 129-131.

* cited by examiner

RADIO FREQUENCY TRANSPARENT PHOTOVOLTAIC CELL

CROSS-REFERENCE TO RELATED APPLICATION(S)

This application is a divisional application of U.S. application Ser. No. 12/661,859, filed on Mar. 25, 2010, the disclosure of which is incorporated by reference herein in its entirety.

FIELD

This invention relates generally to photovoltaic cells, and more specifically to a photovoltaic cell that is transparent to radio frequency electromagnetic radiation.

BACKGROUND

Photovoltaic cells ("PV cells") convert light, such as sunlight, into an electric current. PV cells may provide electric power to a system using solely light as an energy source. Consequently, PV cells may provide electric power to a system without the use of traditional energy sources such as chemical energy sources (e.g., batteries, fossil fuels) and/or an electric power grid.

The ability of PV cells to convert light into an electric current makes PV cells an attractive electric power source in many applications wherein it is undesirable, impractical, uneconomical and/or impossible to use traditional energy sources. For example, PV cells commonly power emergency roadside call boxes located in rural areas where an electric power grid is not readily accessible. As another example, hand held calculators are commonly powered by one or more PV cells; the PV cells allow use of the calculator wherever light is present without requiring the use of batteries or a connection to an electrical outlet.

In certain applications, it is desirable that PV cells be at least partially transparent to one or more predetermined frequencies of radio frequency electromagnetic radiation. For example, if PV cells are to power a radar unit from sunlight, it may be desirable to place the PV cells on an outer surface of the radar unit so that the radar unit's structure will not shadow the PV cells. However, prior art PV cells are generally opaque to radio frequency electromagnetic radiation and therefore, may interfere with operation of the radar unit if placed on the radar unit's outer surface. This opaqueness is largely due to the fact that prior art PV cells generally contain at least one layer of metal, which blocks the passage of radio frequency electromagnetic radiation through the PV cell.

A common source of metal in a PV cell is the PV cell's back contact layer. The back contact layer is one of two electrical contact subsystems in the PV cell that enable it to be electrically connected to an external system. Stated in another manner, the back contact layer may serve as one of two electrical terminals on the PV cell, much like a terminal on a battery. The back contact layer functions to collect electrical charge from the back section of the PV cell. Consequently, the back contact layer must be an electrical conductor and must be in electrical contact with the PV cell.

As its name implies, the back contact layer is generally located near the back or bottom of the PV cell. The back of the PV cell is the PV cell's side that is opposite from the PV cell's light source; the front or top of the PV cell is the PV cell's side that is proximate to the light source. The PV cell's other electrical contact subsystem is often referred to as the top contact layer or subsystem and is commonly located near the front of the PV cell.

A back contact layer may be formed of a material that is non-transparent to light, such as molybdenum, aluminum or nickel. Such materials are also non-transparent to radio frequency electromagnetic radiation. A back contact layer also may be formed of a material that is transparent to light, such as zinc oxide or indium tin oxide. Although such materials are transparent to light, they are non-transparent to radio frequency electromagnetic radiation.

Many prior art PV cells have a solid metallic back contact layer. For example, a prior art PV cell may have a solid back contact layer formed of or containing molybdenum. Although such cells may exhibit relatively high efficiencies, the solid metallic back contact layer also blocks the passage of radio frequency electromagnetic radiation through the PV cell.

Other prior art PV cells have a non-solid metallic back contact layer, an example of which is disclosed in U.S. Pat. No. 4,487,989 to Wakefield et al., entitled "Contact for Solar Cell." Wakefield discloses a PV cell with a back contact layer having a "checkerboard pattern" intended to permit the "passage of radiation through the cell which would otherwise decrease efficiency due to heat generation." Although Wakefield's back contact layer apparently passes at least some infrared radiation, which may generate heat, the back contact layer is not transparent to radio frequency electromagnetic radiation of one or more predetermined frequencies.

Thus, there is a need for a PV cell having a back contact layer that is at least partially transparent to radio frequency electromagnetic radiation of one or more predetermined frequencies ("radio frequency transparent PV cell").

SUMMARY

The radio frequency transparent PV cell and applications thereof herein disclosed advance the art and may overcome at least one of the problems articulated above by providing a photovoltaic cell that is at least partially transparent to radio frequency electromagnetic radiation having one or more predetermined frequencies.

In particular, and by way of example only, a radio frequency transparent photovoltaic cell includes a back contact layer formed of an electrically conductive material, at least one aperture formed in the back contact layer, wherein each aperture has at least two elements, and at least one photovoltaic cell section disposed on the back contact layer.

According to another embodiment, a radio frequency transparent photovoltaic cell includes a back contact layer formed of an electrically conductive material. At least one first aperture having a first length is formed in the back contact layer. At least one second aperture having a second length is formed in the back contact layer. The first length is at least five (5) times the second length. At least one photovoltaic cell section is disposed on the back contact layer.

In yet another embodiment, a method of fabricating a photovoltaic cell back contact layer that is at least partially transparent to radio frequency electromagnetic radiation having at least one predetermined frequency includes creating an electrically conductive back contact layer. The back contact layer has a thickness of at least one skin depth at a lowest predetermined frequency. One or more apertures are created in the back contact layer, wherein each aperture is at least partially transparent to radio frequency electromagnetic radiation having a predetermined frequency.

In yet another embodiment, an airship includes one or more radio frequency antennas disposed in an interior of the airship. One or more radio frequency transparent photovoltaic cells are disposed on an outer surface of the airship.

In yet another embodiment, a method of providing electric power to an airship having one or more radio frequency antennas disposed in an interior of the airship includes disposing one or more radio frequency transparent photovoltaic cells on an outer surface of the airship. Each photovoltaic cell is at least partially transparent to radio frequency electromagnetic radiation having at least one predetermined frequency.

DETAILED DESCRIPTION

The present teaching is by way of example only, not by way of limitation. The concepts herein are not limited to use or application with a specific type of radio frequency transparent PV cell. Thus, although the instrumentalities described herein are for the convenience of explanation, shown and described with respect to exemplary embodiments, it will be appreciated that the principles herein may be applied equally in other types of radio frequency transparent PV cells.

Figure 1:
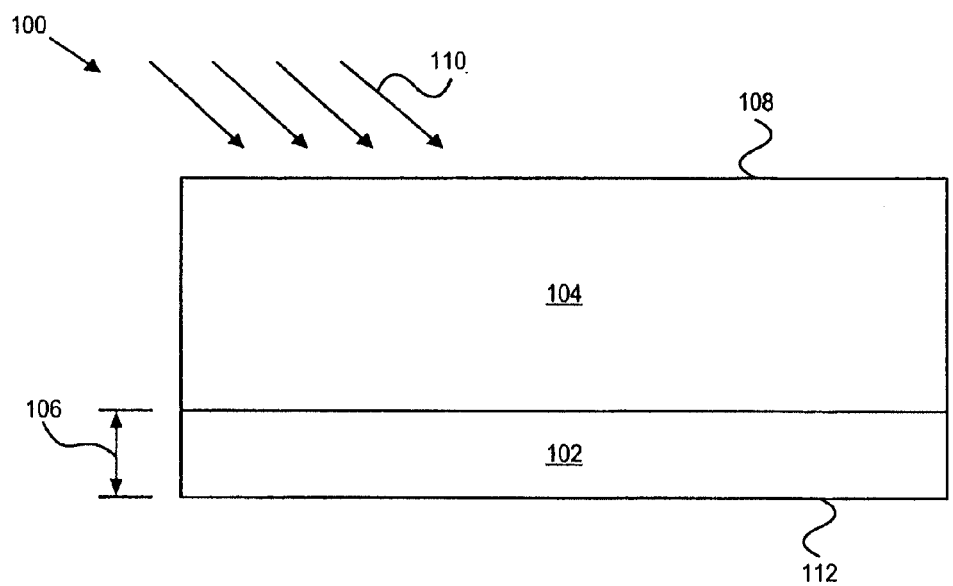
FIG. 1 is a cross sectional view of a radio frequency transparent PV cell, according to an embodiment.

FIG. 1 is a cross sectional view of radio frequency transparent photovoltaic cell 100, also referred to as PV cell 100. PV cell 100 generates an electric current (not shown) in response to incident light 110. PV cell 100 has top or front surface 108 which receives incident light 110. Bottom or back surface 112 is opposite of top or front surface 108.

PV cell 100 includes back contact layer 102 having thickness 106. Back contact layer 102 is formed of or contains a metallic material. Back contact layer 102 has at least one aperture (not shown in FIG. 1); the at least one aperture provides a means for passing radio frequency electromagnetic radiation of one or more predetermined frequencies. Consequently, back contact layer 102 is at least partially transparent to one or more predetermined frequencies of radio frequency electromagnetic radiation. Back contact layer 102 is discussed in more detail below with respect to FIGS. 3-5 and 9-10.

At least one photovoltaic cell section 104 is disposed on back contact layer 102; a plurality of photovoltaic cell sections 104 may be disposed on back contact layer 102 to create a module of a plurality of monolithically integrated PV cells. Each photovoltaic cell section 104 is at least partially transparent to the one or more predetermined frequencies of electromagnetic radiation. Photovoltaic cell section 104 is generally relatively thin and often contains little metal; therefore photovoltaic cell section 104 is often inherently transparent to radio frequency electromagnetic radiation. However, as stated above, back contact layer 102 is formed of or contains a metallic material, and metallic materials inherently block the passage of radio frequency electromagnetic radiation. Consequently, the properties of back contact layer 102 often primarily determine whether PV cell 100 is transparent to radio frequency electromagnetic radiation.

PV cell 100 may be constructed according to PV cell technologies known in the art. For example, PV cell 100 may be a homojunction device, a heterojunction device, a p-i-n device, an n-i-p device, or a multijunction device. In embodiments where PV cell 100 is a multijunction device, PV cell 100 may have a plurality of back contact layers 102, and/or PV cell sections 104. In some embodiments, PV cell 100 is a thin film heterojunction device; exemplary thin film heterojunction embodiments are discussed below with respect to FIGS. 6 and 11-12.

Figure 2:
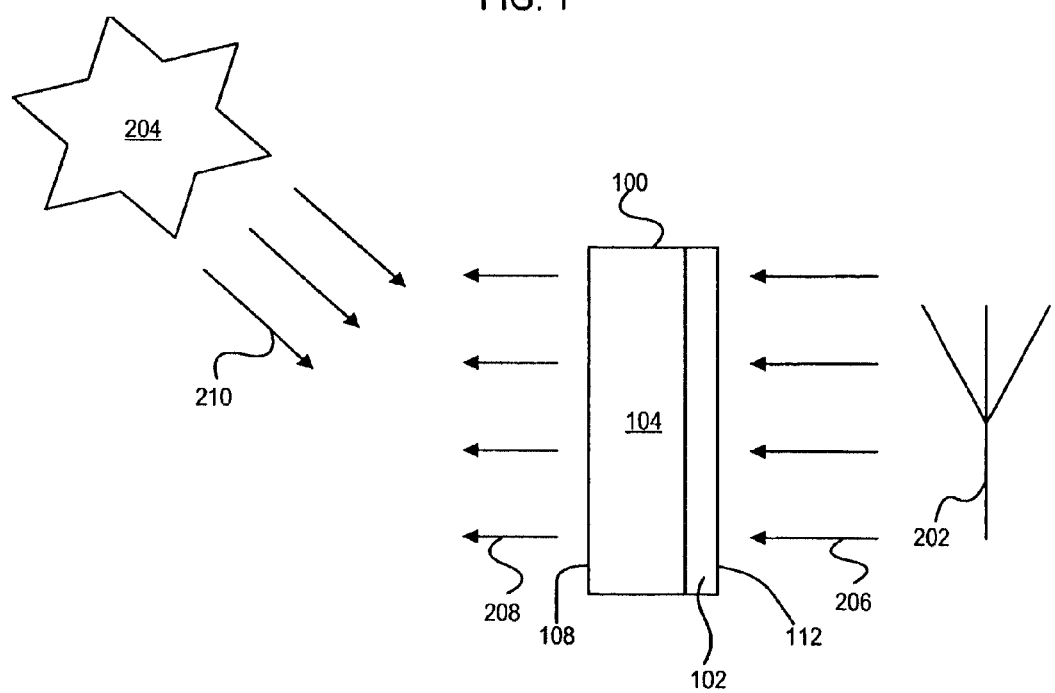
FIG. 2 is a side plan view of an application of a radio frequency transparent PV cell, according to an embodiment.

FIG. 2 illustrates an application of PV cell 100, wherein PV cell 100 is disposed between light source 204 (e.g., the sun) and antenna 202. Front surface 108 receives light 210, and back surface 112 is proximate to antenna 202. In the application of FIG. 2, it is desired that PV cell 100 generate an electric current in response to light 210. However, because PV cell 100 is proximate to antenna 202, it is also desired that PV cell 100 be transparent to microwave energy 206 generated by antenna 202. Microwave energy 206 has a predetermined frequency. Accordingly, back contact layer 102 is tuned to pass electromagnetic radiation of the predetermined frequency. Consequently, as illustrated in FIG. 2, microwave energy 206 impinges back surface 112, passes through back contact layer 102 and PV cell section 104, and emerges from front surface 108 as microwave energy 208.

Figure 3:
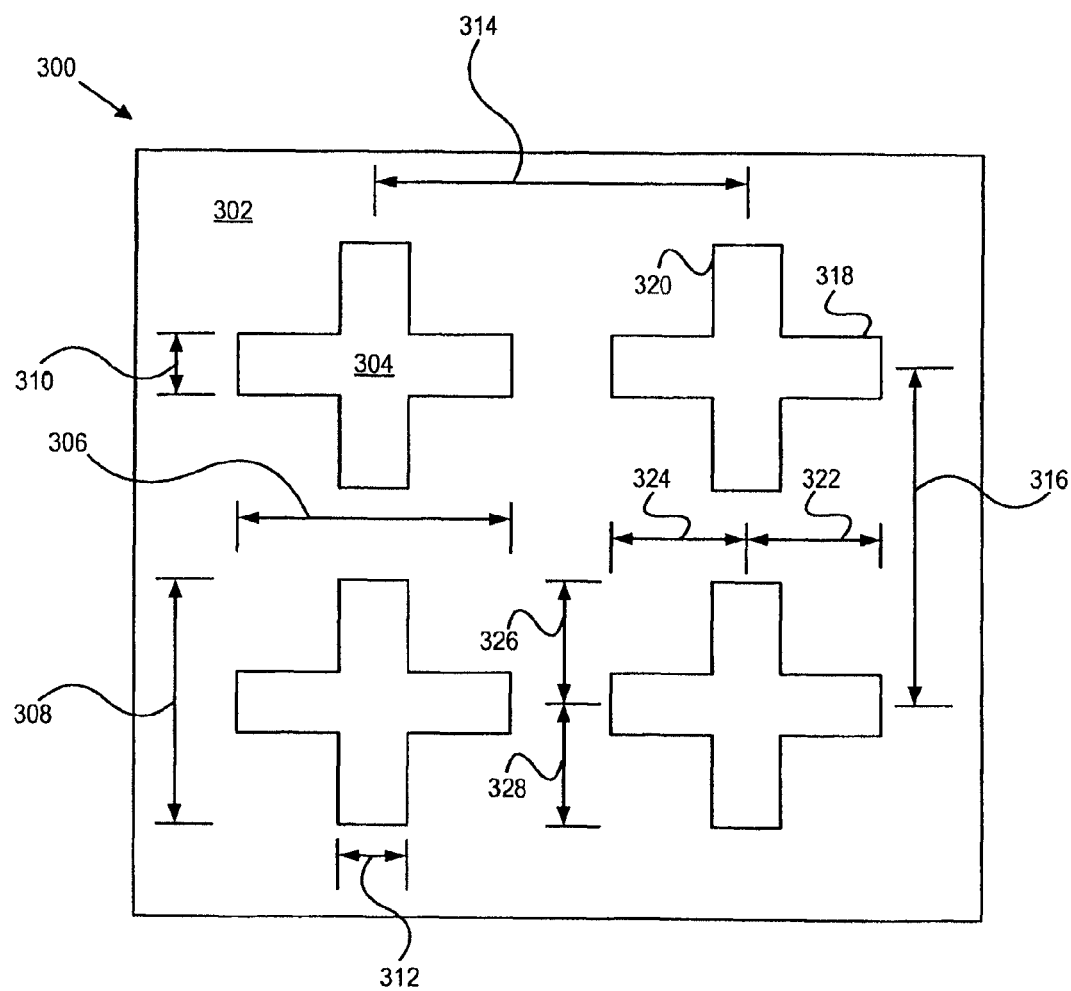
FIG. 3 is a top plan view of a radio frequency transparent back contact layer, according to an embodiment.

FIG. 3 is a top plan view of back contact layer 300. Back contact layer 300, which is tuned to be at least partially transparent to radio frequency electromagnetic radiation of a predetermined frequency, is an embodiment of back contact layer 102.

Back contact layer 300 is formed of electrically conductive metallic material 302. In an embodiment, material 302 is formed of or contains molybdenum. Material 302 has thickness 106 (shown in FIG. 1) at least equal to one skin depth ($\delta$) at the predetermined frequency. Preferably, material 302 has thickness 106 of at least two skin depths. Skin depth is the distance an electromagnetic wave that strikes and penetrates material 302 travels within material 302 until the wave's magnitude is attenuated to 1/e of its original magnitude. The constant e is the base of the natural logarithm and is also known as Napier's constant. The constant e is approximately equal to 2.7183. Skin depth is dependent on the frequency of the impinging electromagnetic wave as well as properties of material 302. Skin depth may be determined using Equation 1 as follows:

$$\delta = \sqrt{\frac{\rho}{\pi f \mu}} \text{ meters} \qquad \text{Equation 1}$$

In Equation 1, $\rho$ is the electrical resistivity in ohms-meters of material 302, $\mu$ is the permeability in henries per meter of material 302, and f is the frequency of the electromagnetic radiation impinging material 302.

As an example, if back contact layer 300 is to be tuned to be at least partially transparent to radio frequency electromagnetic radiation having a predetermined frequency of 10 GHz, and material 302 consists of molybdenum, the skin depth of material 302 at the predetermined frequency of 10 GHz may be determined as follows. First, the resistivity and permeability of molybdenum are determined. The resistivity of molybdenum is about 5.7×10$^{-8}$ ohms-meter, and the permeability of molybdenum is about 4π×10$^{-7}$ henries per meter. Using Equation 1, the skin depth of molybdenum at 10 GHz may be calculated as follows:

$$\delta = \sqrt{\frac{5.7 \times 10^{-8}}{\pi(10^{10})(4\pi 10^{-7})}} = 1.20 \times 10^{-6} \text{meters}(1.20 \text{ microns}). \qquad \text{Equation 2}$$

Because the skin depth is 1.20 microns, material 302 has thickness 106 of at least 1.20 microns.

Back contact layer 300 has apertures 304 which allow electromagnetic radiation of a predetermined frequency to at least partially pass through back contact layer 300. Although back contact layer 300 is shown having four (4) apertures 304, back contact layer 300 may have a greater or smaller quantity of apertures 304. In an embodiment, at least ninety (90) percent of a surface area of back contact layer 300 is electrically conductive and thus not covered with apertures 304.

The geometric form (e.g., shape and size) of apertures 304 determine what frequency of radio frequency electromagnetic radiation apertures 304 will pass through back contact layer 300. Apertures 304 have a cross shape; each aperture 304 has horizontal element 318 and vertical element 320. Horizontal element 318 and vertical element 320 are displaced from each other at about ninety (90) degrees. Apertures 304 are essentially symmetrical; dimension 322 is about equal to dimension 324, and dimension 326 is about equal to dimension 328.

The frequency of electromagnetic radiation that may pass through apertures 304 is largely dependent on the lengths of each element, lengths 306 and 308. The length of each element is about equal to one half of the wavelength of the electromagnetic radiation at the predetermined frequency. The length of each element (lengths 306 and 308) may be approximated as a function of the predetermined frequency (f) as follows:

$$\text{length} \approx \frac{3 \times 10^8}{2f} \text{meters}. \qquad \text{Equation 3}$$

As an example, if back contact layer 300 is to be at least partially transparent to electromagnetic radiation having a predetermined frequency of ten (10) GHz, lengths 306 and 308 of the elements 318 and 320 respectively are approximated as follows using Equation 3:

$$\text{length} \approx \frac{3 \times 10^8}{2(10 \times 10^9)} = 1.5 \text{ centimeters}(15 \text{ millimeters}). \qquad \text{Equation 4}$$

Consequently, lengths 306 and 308 would be approximately 15 millimeters.

The bandwidth of each aperture 304 is dependent on widths 310 and 312 of each element, as well as on spacing 314 and 316 of each aperture. Bandwidth is the size of the frequency spectrum, which is centered about the predetermined frequency, that apertures 304 are transparent to. In order to determine the bandwidth of an aperture, a maximum permitted attenuation level must be defined. For example, if the maximum permitted attenuation level is defined as ten (10) dB, then an aperture is considered to pass electromagnetic radiation only to the extent the aperture attenuates the electromagnetic radiation by ten (10) dB or less. Thus, if an aperture has a bandwidth of two hundred (200) MHz, the aperture allows electromagnetic radiation having a frequency within one hundred (100) MHz of the predetermined frequency to pass through the aperture with ten (10) dB or less of attenuation.

The bandwidth of apertures 304 generally becomes smaller as the ratios of dimensions 314 to 306 and dimensions 316 to 308 are increased. Similarly, the bandwidth of apertures 304 also becomes smaller if the ratios of dimensions 314 to 312 and dimensions 316 to 310 are increased.

Apertures 304 are non-polarized because elements 318 and 320 are essentially perpendicular to each other. A non-polarized aperture passes electromagnetic radiation that is either perpendicular or parallel to any given side of the aperture. Apertures 304 will at least partially pass electromagnetic radiation at the predetermined frequency that is collinear to either elements 318 or 320. An embodiment of a back contact layer having polarized apertures is discussed below with respect to FIG. 5.

As discussed above, back contact layer 300 at least partially passes radio frequency electromagnetic radiation having a single predetermined frequency because back contact layer 300 has apertures of a single geometric form. However, a back contact layer may be formed that at least partially passes radio frequency electromagnetic radiation of a plurality of predetermined frequencies by including a plurality of different sized and/or shaped apertures.

Figure 4:
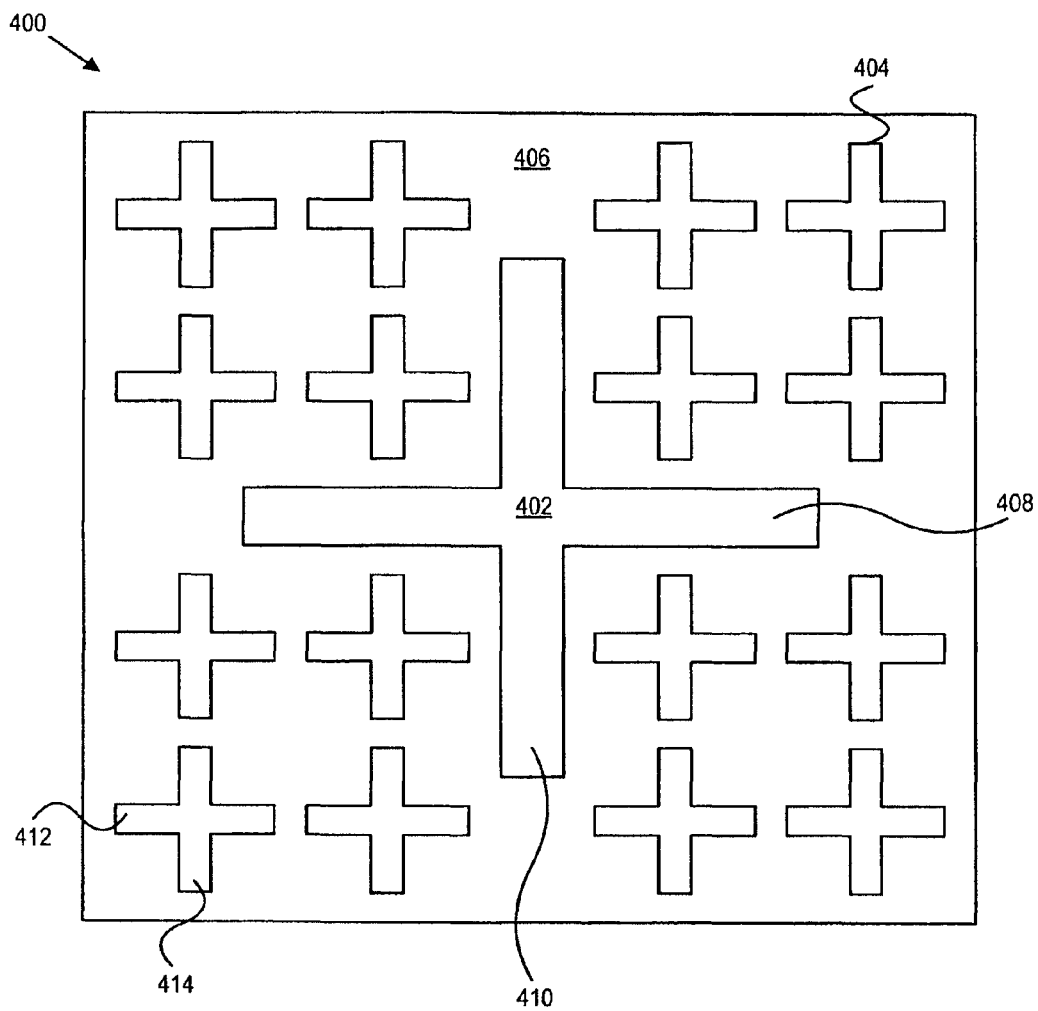
FIG. 4 is a top plan view of a radio frequency transparent back contact layer, according to an embodiment.

FIG. 4 is a top plan view of radio frequency transparent back contact layer 400, which is an embodiment of back contact layer 102. Back contact layer 400 may at least partially pass radio frequency electromagnetic radiation of two predetermined frequencies.

Back contact layer 400 is formed of or contains electrically conductive metallic material 406. In an embodiment, material 406 is formed of or contains molybdenum. Back contact layer 400 has thickness 106 (shown in FIG. 1) of at least one skin depth at the lowest predetermined frequency. Preferably, back contact layer 400 has thickness 106 of at least two skin depths at the lowest predetermined frequency. Skin depth may be determined using Equation 1 as discussed above with respect to FIG. 3.

Back contact layer 400 has large aperture 402 and small apertures 404. Although back contact layer 400 is illustrated having one (1) large aperture 402 and sixteen (16) small apertures 404, back contact layer 400 may have a greater or smaller quantity of each size aperture. In an embodiment, at least ninety (90) percent of a surface area of back contact layer 400 is electrically conductive and thus not covered with apertures 402 or 404. Moreover, it is understood and appreciated that in at least one embodiment, back contact layer 400 has at least a first aperture having a first geometric form and a second aperture having a second geometric form. The difference between the first and second geometric forms may be a matter of scale, as in aperture 402 and apertures 404, or they may be entirely different in shape and form. As shown, in at least one embodiment the first and second geometric form is that of a cross shape.

Aperture 402 has horizontal element 408 and vertical element 410. The length of horizontal element 408 is about equal to the length of vertical element 410, and horizontal element 408 is displaced from vertical element 410 by about ninety (90) degrees.

Apertures 404 have horizontal elements 412 and vertical elements 414. The length of each horizontal element 412 is about equal to the length of each vertical element 414, and each horizontal element 412 is displaced from each vertical element 414 by about ninety (90) degrees. In an embodiment, the length of horizontal element 408 is at least five (5) times the length of horizontal element 412, and the length of vertical element 410 is at least five (5) times the length of vertical element 414.

Equation 3 may be arranged such that the predetermined frequency (f) of an aperture is largely a function of its length as follows:

$$f \approx \frac{3 \times 10^8}{2(\text{length})} \text{Hz.} \qquad \text{Equation 5}$$

It can be determined by inspecting Equation 5 that the predetermined frequency (f) is inversely proportional to aperture length.

In back contact layer 400, the lengths of elements 408 and 410 of large aperture 402 are greater than the lengths of elements 412 and 414 of small apertures 404. Consequently, apertures 404 are at least partially transparent to electromagnetic radiation of a higher frequency than aperture 402. Accordingly, aperture 402 at least partially passes electromagnetic radiation of the lower predetermined frequency, and apertures 404 at least partially pass electromagnetic radiation of the higher transmission frequency. For example, apertures 404 may be tuned to pass X-band microwave electromagnetic radiation of a predetermined frequency of ten (10) GHz, and aperture 402 may be tuned to pass UHF band microwave electromagnetic radiation of a predetermined frequency of four hundred fifty (450) MHz. Thus, back contact layer 400 as a whole may be at least partially transparent to microwave electromagnetic radiation of a predetermined frequency of ten (10) GHz, as well as microwave electromagnetic radiation of a predetermined frequency of four hundred fifty (450) MHz. In an embodiment, if an upper frequency range of radio frequency is defined as three hundred (300) GHz, lengths of elements 408, 410, 412 and 414 are at least zero-point-five (0.5) millimeters.

Figure 5:
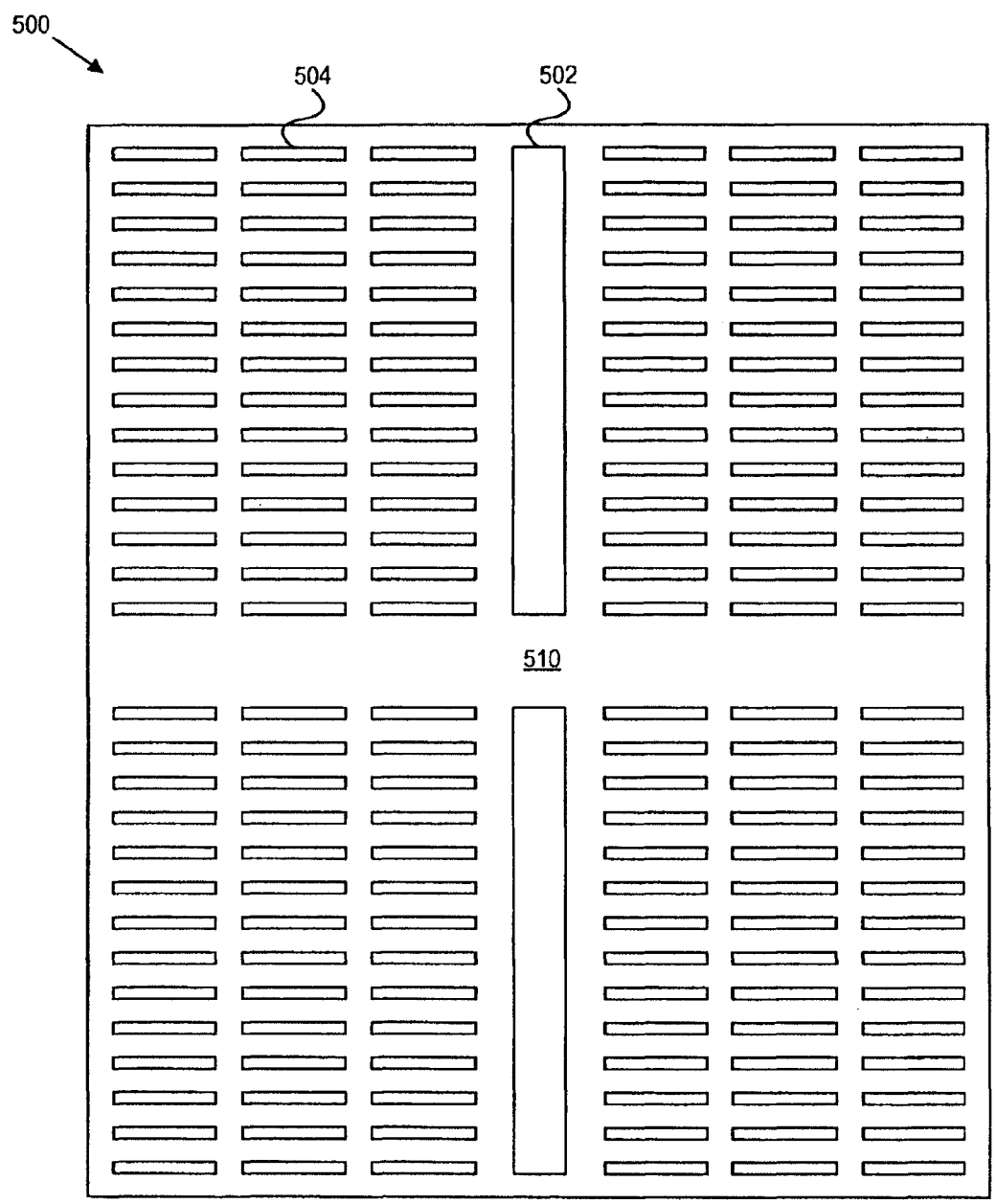
FIG. 5 is a top plan view of a radio frequency transparent back contact layer, according to an embodiment.

FIG. 5 is a top plan view of back contact layer 500, which is an embodiment of back contact layer 102. Back contact layer 500 may be at least partially transparent to radio frequency electromagnetic radiation of two predetermined frequencies.

Back contact layer 500 is formed of or contains electrically conductive metallic material 510. In an embodiment, material 510 is formed of or contains molybdenum. Back contact layer 500 has thickness 106 (shown in FIG. 1) of at least one skin depth at the lowest predetermined frequency. Preferably, back contact layer 500 has thickness 106 of at least two skin depths at the lowest predetermined frequency. Skin depth may determined using Equation 1 as discussed above with respect to FIG. 3.

Back contact layer 500 includes large apertures 502 and small apertures 504. Although back contact layer 500 is illustrated as having two (2) large apertures 502 and one hundred sixty-eight (168) small apertures 504, back contact layer 500 can have any quantity of large apertures 502 and any quantity of small apertures 504. Furthermore, back contact layer 500 can have one or more apertures of one or more different sizes and/or shapes. Although large apertures 502 and small apertures 504 are illustrated as being orthogonal to each other, apertures in back contact layer 500 may be displaced at any angle with respect to other apertures. In an embodiment, a length of large aperture 502 is at least five (5) times the length of small aperture 504. In an embodiment, if an upper frequency range of radio frequency is defined as three hundred (300) GHz, lengths of the long sides of apertures 502 and 504 are at least zero-point-five (0.5) millimeters. In an embodiment, at least ninety (90) percent of a surface area of back contact layer 500 is electrically conductive.

Apertures 502 and 504 are rectangular shaped. Consequently, apertures 502 and 504 are polarized, and therefore, each aperture only passes electromagnetic radiation polarized with a magnetic field parallel to (or collinear with) the aperture.

Apertures increase the resistance of back contact layer 500 by decreasing the conductive surface area of back contact layer 500. Consequently, the resistance of back contact layer 500 decreases as aperture surface area decreases. Because rectangular apertures, such as apertures 502 and 504, only have a single element, rectangular apertures may have a smaller surface area than corresponding cross shaped apertures; therefore back contact layer 500 may have a lower resistance than a back contact layer having corresponding cross shaped apertures. In some embodiments, decreasing the resistance of a back contact layer improves the efficiency of the PV cell constructed with the back contact layer. Consequently, in some embodiments, a PV cell's efficiency can be improved by constructing the PV cell with a back contact layer having rectangular apertures instead of cross shaped apertures.

Figure 6:
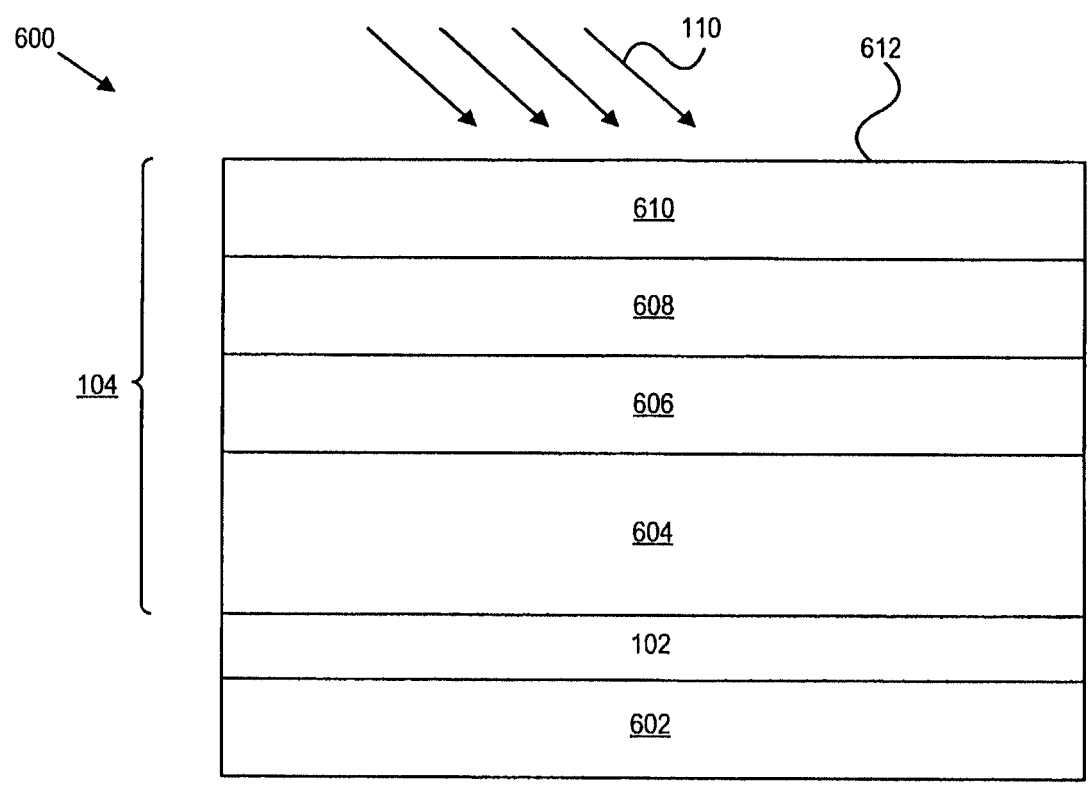
FIG. 6 is a cross sectional view of a radio frequency transparent PV cell, according to an embodiment.

As discussed above, PV cell 100 may be a thin film heterojunction device. FIG. 6 is a cross sectional view of radio frequency transparent PV cell 600, which is a thin film heterojunction device. A thin film PV cell is formed by consecutively depositing a plurality of layers on a substrate. PV cell 600 is an embodiment of PV cell 100 and is at least partially transparent to radio frequency electromagnetic radiation having one or more predetermined frequencies. In PV cell 600, PV cell section 104 includes solar absorber layer 604, window layer 606, top contact layer 608, and encapsulation layer 610.

Substrate 602 serves as a base to PV cell 600. Substrate 602 is electrically non-conductive and at least partially transparent to radio frequency electromagnetic radiation of the one or more predetermined frequencies. In an embodiment, substrate 602 is flexible, which may result in PV cell 602 being flexible. Substrate 602 may be formed of or contain a polyimide material.

Back contact layer 102 is disposed on substrate 602. Back contact layer 102 provides an electrical connection to PV cell 600, and back contact layer 102 is tuned to be at least partially transparent to radio frequency electromagnetic radiation of the one or more predetermined frequencies. In an embodiment, back contact layer 102 is formed of or contains molybdenum. By way of example and not of limitation, back contact layer 102 may be back contact layer 300 of FIG. 3, back contact layer 400 of FIG. 4, or back contact layer 500 of FIG. 5.

Photovoltaic section 104 includes four discrete layers, solar absorber layer 604, window layer 606, top contact layer 608, and encapsulation layer 610. Solar absorber layer 604 is deposited on back contact layer 102 opposite of substrate 602. Solar absorber layer 604 absorbs light 110 that impinges top surface 612 and travels through encapsulation layer 610, top contact layer 608, and window layer 606 to reach solar absorber layer 604. Solar absorber layer 604 also forms one half of a P/N junction. A P/N junction is a junction of two layers of dissimilar semiconductor materials. One of the layers of semiconductor materials has a surplus of electrons as is frequently referred to as "n-type" material; the other layer of semiconductor materials has a surplus of holes and is frequently referred to as "p-type" material. Solar absorber layer 604 is at least partially transparent to radio frequency electromagnetic radiation having the one or more predetermined frequencies. In an embodiment, solar absorber layer 604 is a p-type material formed of or including copper, indium, gallium and selenide.

Window layer 606 is disposed on solar absorber layer 604 opposite of back contact layer 102. Window layer 606, which forms the second half of the P/N junction, allows incident light 110 to reach solar absorber layer 604. Window layer 606 is at least partially transparent to radio frequency electromagnetic radiation having the one or more predetermined frequencies. In an embodiment, window layer 606 is an n-type material formed of or including cadmium sulfide.

Top contact layer 608 is disposed on window layer 606 opposite of solar absorber layer 604. Top contact layer 608 collects electrical charge generated near the top of photovoltaic cell section 104. Top contact layer 608 is at least partially transparent to light 110 to allow light 110 to reach the remainder of photovoltaic cell section 104. Additionally, top contact layer 608 is at least partially transparent to radio frequency electromagnetic radiation having the one or more predetermined frequencies. Furthermore, top contact layer 608 must be electrically conductive so that it can collect electric charge.

Figure 7:
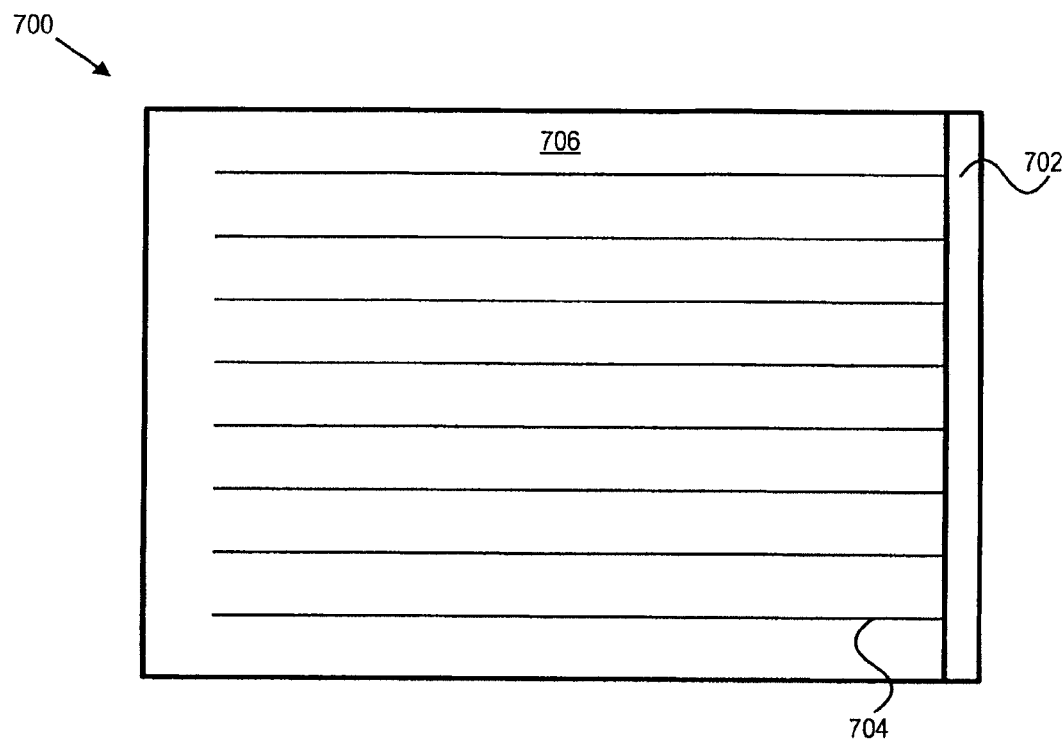
FIG. 7 is a top plan view of a top contact subsystem, according to an embodiment.

FIG. 7 illustrates top contact subsystem 700, which is an embodiment of top contact layer 608. Top contact subsystem 700 functions to collect electric charge from an area near top 612 of PV cell 600. Top contact subsystem 700 includes bus bar 702, which is formed of or includes a metallic material. Bus bar 702 serves to consolidate electric charge collected by conductive fingers 704, which are also formed of or include a metallic material. Bus bar 702 may serve as one of two electrical connection points to interface PV cell 600 to an external system. (Back contact layer 102 may serve as the other electrical connection point.)

Fingers 704 occupy a relatively small proportion of surface 706 of top contact subsystem 700. Consequently, a significant portion of light and radio frequency electromagnetic radiation that impinge top contact subsystem 700 pass through top contact subsystem 700.

Returning to FIG. 6, encapsulation layer 610 is disposed on top contact layer 608 opposite of window layer 606. Encapsulation layer 610 passivates PV cell 600. Stated in another manner, encapsulation layer 610 protects PV cell 600 from adverse environmental elements, such as precipitation. In an embodiment, encapsulation layer 610 has antireflective properties to reduce the amount of incident light 110 reflected by PV cell 600. Encapsulation layer 610 is at least partially transparent to radio frequency electromagnetic radiation having the one or more predetermined frequencies.

As stated above, all layers of PV cell 600 are at least partially transparent to radio frequency electromagnetic radiation having the one or more predetermined frequencies. Consequently, PV cell 600 is at least partially transparent to electromagnetic radiation having the one or more predetermined frequencies.

Figure 8:
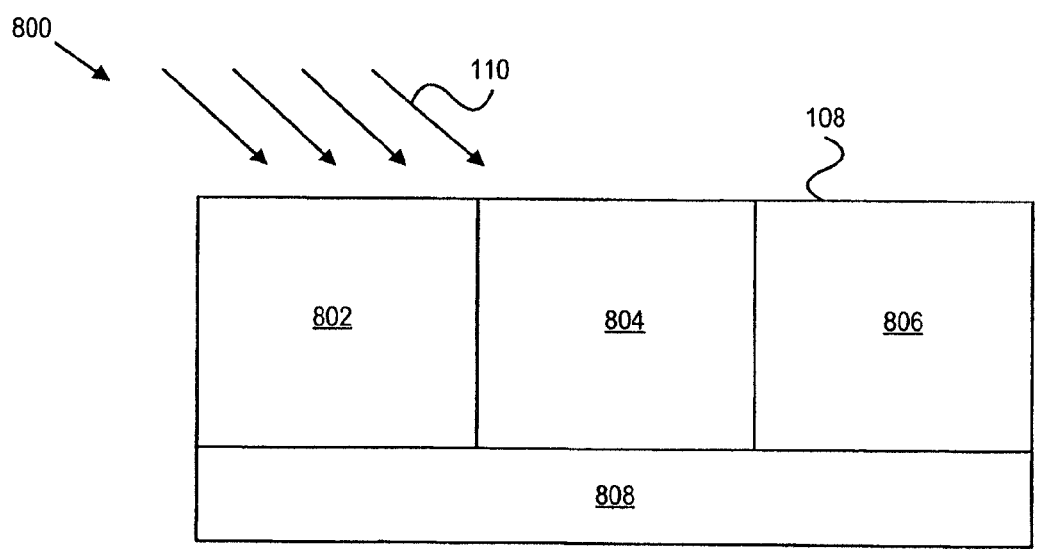
FIG. 8 is a cross sectional view of a module of radio frequency transparent PV cells, according to an embodiment.

As stated above with respect to FIG. 1, a plurality of PV cell sections 104 may be disposed on back contact layer 102 in order to form a module of PV cells. Stated in another manner, back contact layer 102 may be used as a base for a module of monolithically integrated PV cells. FIG. 8 illustrates module 800, which is an embodiment of PV cell 100 having a plurality of PV cell sections 104. Module 800 includes PV cell sections 802, 804 and 806, each of which are embodiment of PV cell section 104. PV cell sections 802, 804 and 806 are disposed on back contact layer 808, which is an embodiment of back contact layer 102. Although FIG. 8 illustrates module 800 as having three (3) PV cell sections, module 800 can have any quantity of PV cell sections.

Figure 9:
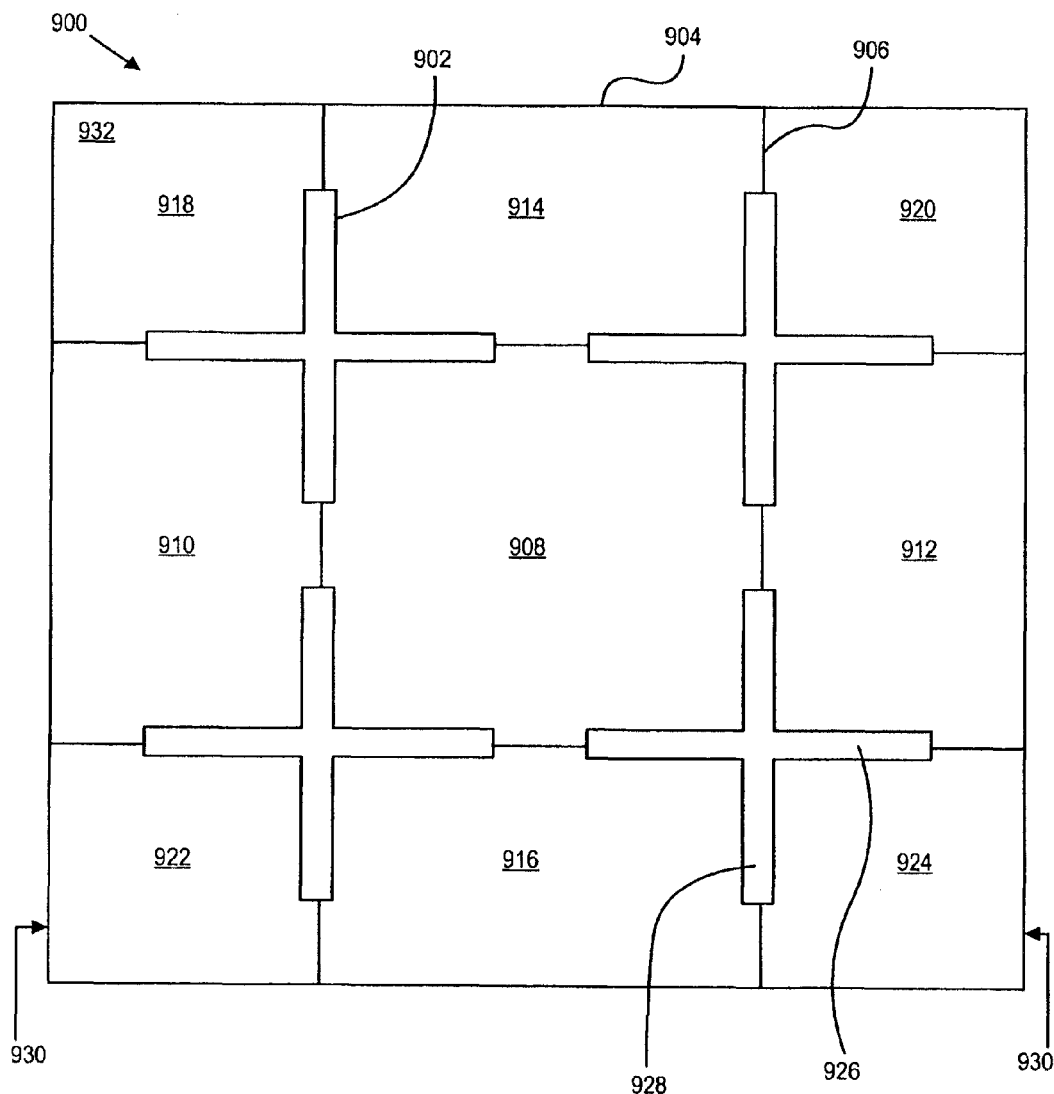
FIG. 9 is a top plan view of a radio frequency transparent back contact layer, according to an embodiment.

FIG. 9 is a top plan view of back contact layer 900, which is an embodiment of back contact layer 808 of FIG. 8. Back contact layer 900 may be used in module 800 to create a module having a plurality of PV cells electrically connected in a series configuration.

Back contact layer 900 is formed of or contains electrically conductive, metallic material 932. In an embodiment, material 932 is formed of or contains molybdenum. Back contact layer 900 has thickness 106 (shown in FIG. 1) of at least one skin depth at the lowest predetermined frequency. Preferably, back contact layer 900 has thickness 106 of at least two skin depths at the lowest predetermined frequency. Skin depth may determined using Equation 1 as discussed above with respect to FIG. 3.

Back contact layer 900 is illustrated as having four identically sized and shaped apertures 902. Consequently, back contact layer 900 is at least partially transparent to electromagnetic radiation having a single predetermined frequency, wherein the predetermined frequency is largely determined by the lengths of horizontal elements 926 and vertical elements 928. However, back contact layer 900 may have any quantity of apertures, and back contact layer 900 may have a plurality of different sized and/or shaped apertures. Accordingly, other embodiments of back contact layer 900 may be at least partially transparent to electromagnetic radiation having a plurality of predetermined frequencies.

In an embodiment, apertures 902 are used to partially delineate individual PV cells in module 800. However, because back contact layer 900 is intended to be used to create a module having a plurality of PV cells connected in a series configuration, each individual PV cell must be completely delineated. Accordingly, additional cuts, or scribes, illustrated as lines 906 in FIG. 9, are made to further delineate each PV cell. Finally, outer edge 904 is used to complete delineation of at least some PV cells. In an embodiment, scribes 906 may be collinear with horizontal elements 926 and vertical elements 928 of apertures 902. In the embodiment illustrated in FIG. 9, back contact layer 900 delineates nine (9) individual PV cells represented as PV cells 908, 910, 912, 914, 916, 918, 920, 922 and 924.

Figure 10:
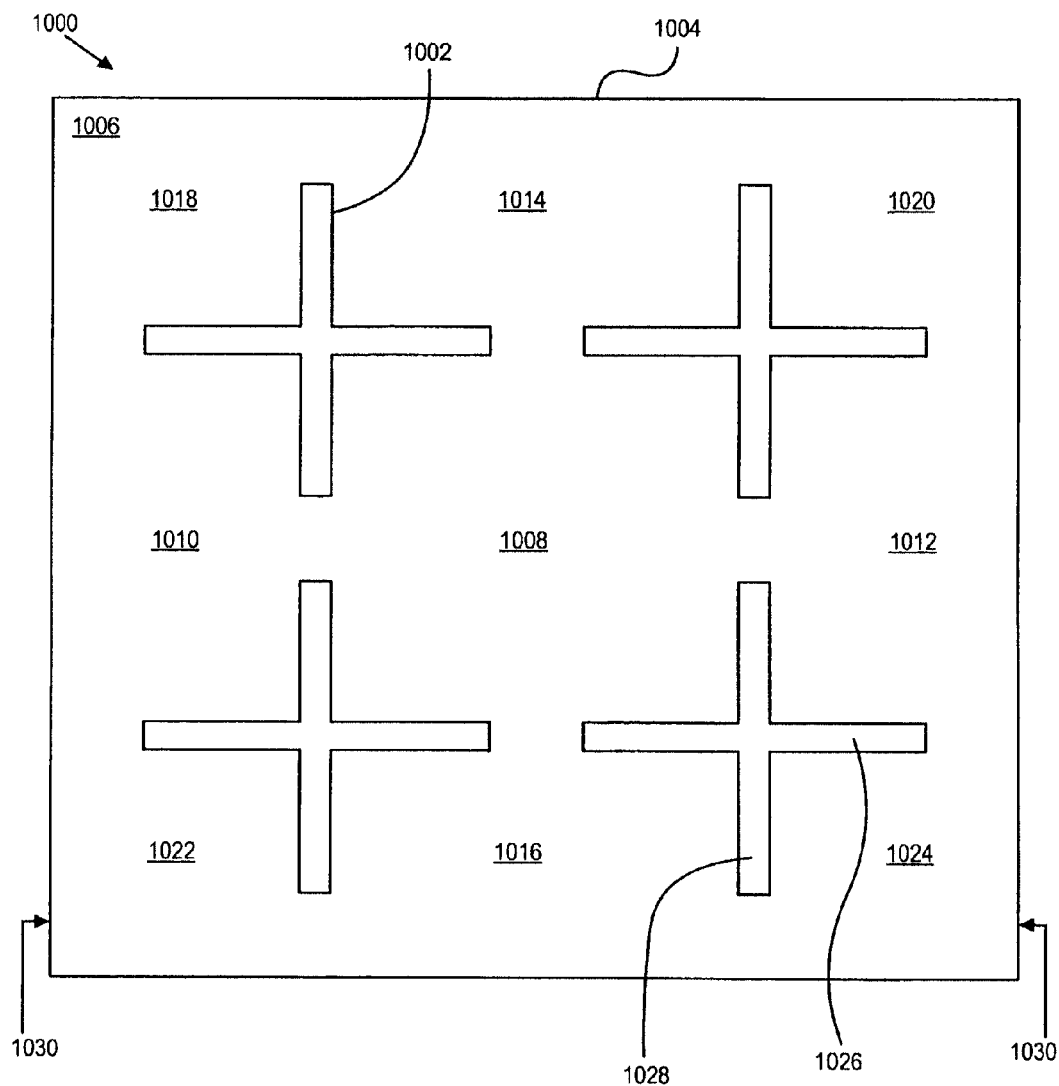
FIG. 10 is a top plan view of a radio frequency transparent back contact layer, according to an embodiment.

FIG. 10 is a top plan view of back contact layer 1000, which is an embodiment of back contact layer 808 of FIG. 8. Back contact layer 1000 may be used in module 800 to create a module having a plurality of PV cells electrically connected in a parallel configuration.

Back contact layer 1000 is formed of or contains electrically conductive metallic material 1006. In an embodiment, material 1006 is formed of or contains molybdenum. Back contact layer 1000 has thickness 106 (shown in FIG. 1) of at least one skin depth at the lowest predetermined frequency. Preferably, back contact layer 1000 has thickness 106 of at least two skin depths at the lowest predetermined frequency. Skin depth may be determined using Equation 1 as discussed above with respect to FIG. 3.

Back contact layer 1000 is illustrated as having four identically sized and shaped apertures 1002. Consequently, back contact layer 1000 is at least partially transparent to electromagnetic radiation have a single predetermined frequency, wherein the frequency is largely determined by the lengths of horizontal elements 1026 and vertical elements 1028. However, back contact layer 1000 may have any quantity of apertures, and back contact layer 1000 may have a plurality of different sized and/or shaped apertures. Accordingly, other embodiments of back contact layer 1000 may be at least partially transparent to electromagnetic radiation having a plurality of predetermined frequencies.

In an embodiment, apertures 1002 are used to partially delineate individual PV cells in module 800. However, because back contact layer 1000 is intended to be used to create a module having a plurality of PV cells connected in a parallel configuration, the back contact layer of each PV cell must be electrically connected to the back contact layer of each other PV cell. Accordingly, each PV cell is partially delineated by apertures 1002, and some PV cells are also partially delineated by outer edge 1004. However, the back contact layers of each individual PV cell are electrically interconnected by solid back contact layer sections collinear with horizontal elements 1026 and vertical elements 1028. In the embodiment illustrated in FIG. 10, back contact layer 1000 partially delineates nine (9) individual PV cells represented as PV cells 1008, 1010, 1012, 1014, 1016, 1018, 1020, 1022 and 1024.

Figure 11:
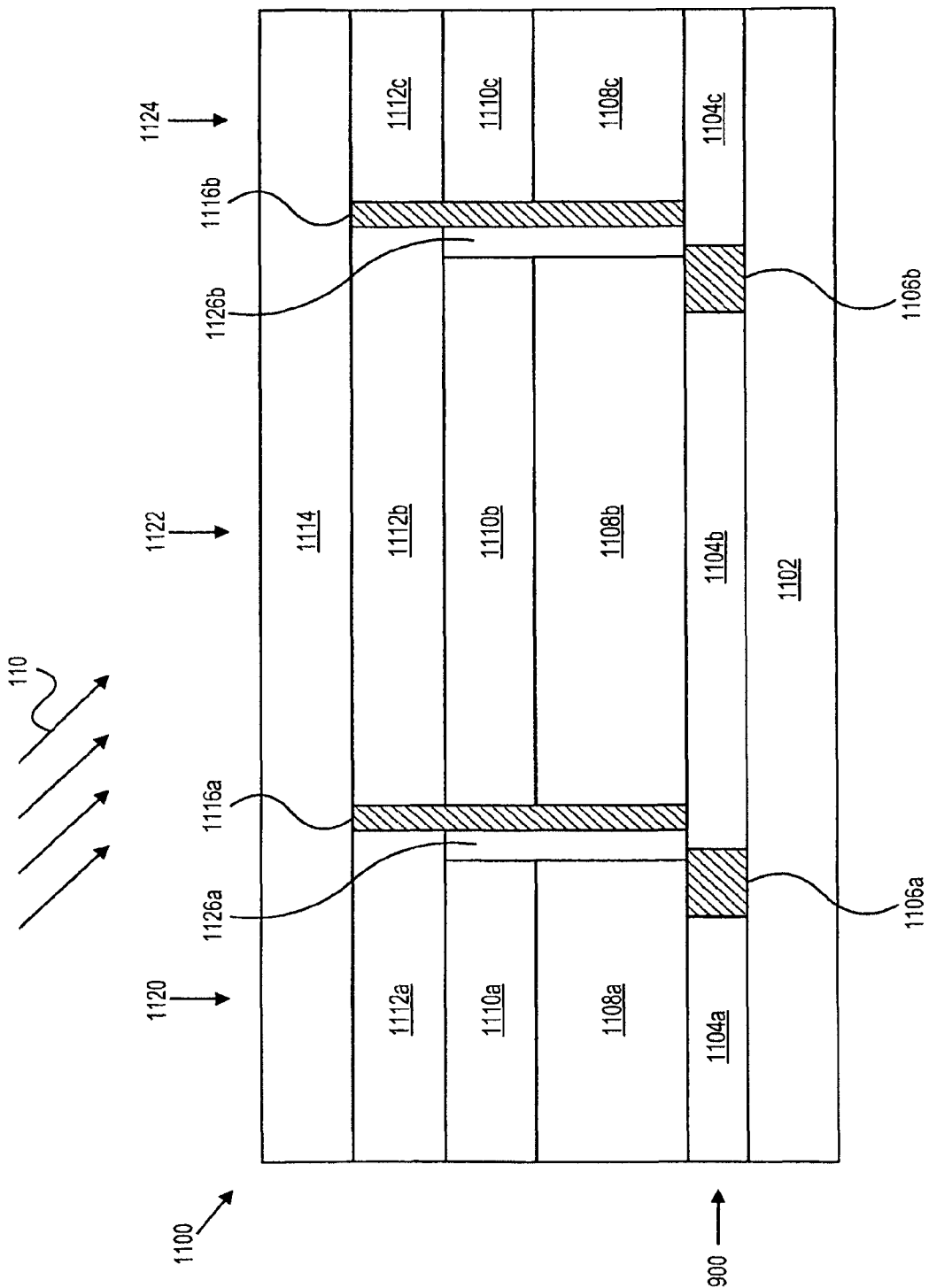
FIG. 11 is a cross sectional view of a module of radio frequency transparent PV cells, according to an embodiment.

FIG. 11 is a cross sectional view of module 1100 of a plurality of PV cells. Module 1100 is an embodiment of module 800 of FIG. 8. Module 1100 includes back contact layer 900 of FIG. 9, and the cross section of module 1100 is taken along line 930 of FIG. 9.

Module 1100 is at least partially transparent to radio frequency electromagnetic radiation having one or more predetermined frequencies. Although module 1100 is illustrated as having three (3) PV cells 1120, 1122, and 1124, module 1100 may have any quantity of PV cells. Each PV cell in module 1100 is electrically connected in a series configuration.

Module 1100 is monolithically integrated onto substrate 1102. Substrate 1102 is electrically non-conductive and at least partially transparent to radio frequency electromagnetic radiation of the one or more predetermined frequencies. In an embodiment, substrate 1102 is flexible, and module 1100 is flexible. In an embodiment, substrate 1102 may be formed of or contain a polyimide material.

Back contact layer 900 is disposed on substrate 1102. Sections 1104a, 1104b and 1104c of back contact layer 900 are visible in FIG. 11. Sections 1104a, 1104b and 1104c respectively correspond to sections 922, 916, and 924 of back contact layer 900.

Sections 1106a and 1106b are non-electrically conductive. Sections 1106a and 1106b represent cross sections of scribes 906 as illustrated in FIG. 9.

Sections 1104a, 1104b and 1104c of back contact layer 900 each form the base of PV cells 1120, 1122 and 1124, respectively. Respectively disposed on back contact layer sections 1104a, 1104b and 1104c are solar absorber layer sections 1108a, 1108b and 1108c. Solar absorber layer sections 1108a, 1108b and 1108c form one half of a P/N junction and absorb light 110 that reaches the solar absorber layer sections. Solar absorber layer sections 1108a, 1108b and 1108c are at least partially transparent to radio frequency electromagnetic radiation having the one or more predetermined frequencies. In an embodiment, solar absorber layer sections 1108a, 1108b and 1108c are a p-type material formed of or including copper, indium, gallium and selenide.

Respectively disposed on solar absorber layer sections 1108a, 1108b, and 1108c are window layer sections 1110a, 1110b and 1110c, which form the second half of P/N junctions. Window layer sections 1110a, 1110b and 1110c help direct incident light 110 to solar absorber layer sections 1108a, 1108b and 1108c, respectively. Window layer sections 1110a, 1110b and 1110c are at least partially transparent to radio frequency electromagnetic radiation having the one or more predetermined frequencies. In an embodiment, window layer sections 1110a, 1110b and 1110c are an n-type material formed of or including cadmium sulfide.

Respectively disposed on window layer sections 1110a, 1110b and 1110c are top contact layer sections 1112a, 1112b and 1112c. Because the PV cells 1120, 1122 and 1124 are electrically connected in a series configuration, the top of PV cell 1120 is electrically connected to the bottom of PV cell 1122, and the top of PV cell 1122 is electrically connected to the bottom of PV cell 1124. Accordingly, connector 1126a connects top contact layer section 1112a to back contact layer section 1104b, and connector 1126b connects top contact layer section 1112b to back contact layer section 1104c. Connectors 1126a and 1126b are electrically conductive.

Top contact layer sections 1112a, 1112b and 1112c are at least partially transparent to light 110 to allow light 110 to reach the remainder of photovoltaic cells 1120, 1122 and 1124, respectively. Additionally, top contact layer sections 1112a, 1112b and 1112c are at least partially transparent to radio frequency electromagnetic radiation having the one or more predetermined frequencies. Furthermore, top contact layer sections 1112a, 1112b and 1112c must be electrically conductive so that they can collect electric charge. In an embodiment, top contact layer sections 1112a, 1112b and 1112c are embodiments of top contact subsystem 700 of FIG. 7.

Insulating section 1116a separates PV cell 1120 from PV cell 1122; insulating section 1116b separates PV cell 1122 from PV cell 1124. Insulating sections 1116a and 1116b may be formed by cutting or etching module 1100, and insulating sections 1116a and 1116b may be filled with an insulating material.

Encapsulation layer 1114 is applied to top contact layer sections 1112a, 1112b and 1112c as well as to insulating sections 1116a and 1116b. As was discussed with respect to FIG. 6, encapsulation layer 1114 passivates module 1100. In an embodiment, encapsulation layer 1114 has antireflective properties to reduce the amount of incident light 110 reflected by module 1100. Encapsulation 1114 is at least partially transparent to radio frequency electromagnetic radiation having the one or more predetermined frequencies.

Figure 12:
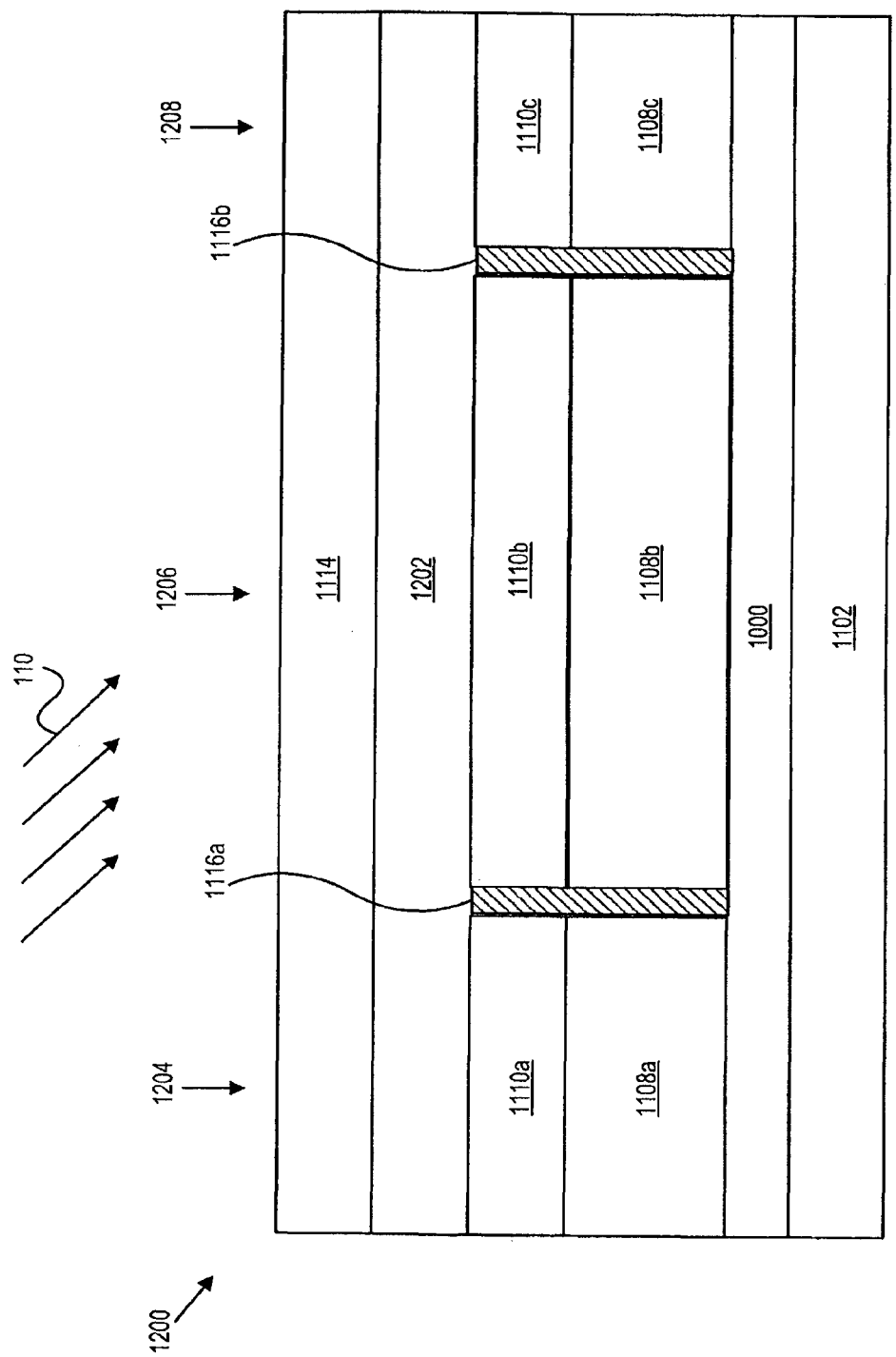
FIG. 12 is a cross sectional view of a module of radio frequency transparent PV cells, according to an embodiment.

FIG. 12 is a cross sectional view of module 1200 of a plurality of PV cells. Module 1200 is an embodiment of module 800 of FIG. 8, and is similar to module 1100 of FIG. 11. Module 1200 includes back contact layer 1000 of FIG. 10, and the cross section of FIG. 12 is taken along line 1030 of FIG. 10.

Module 1200 is at least partially transparent to electromagnetic radiation having one or more predetermined frequencies. Although module 1200 is illustrated as having three (3) PV cells 1204, 1206 and 1208, module 1200 may have any quantity of PV cells. Each PV cell in module 1200 is electrically connected in a parallel configuration.

Module 1200 is monolithically integrated onto substrate 1102, which was discussed with respect to FIG. 11. Back contact layer 1000 is disposed on substrate 1102. As illustrated in FIG. 12, back contact layer 1000 is uninterrupted due to the cross section of module 1200 being taken along line 1030 of FIG. 10. Line 1030 traverses sections of back contact layer 1000 that are not interrupted by apertures 1002. As was discussed above, the back contact layer sections of each PV cell must be electrically interconnected if each PV is to be electrically connected in a parallel configuration.

Respectively disposed on back contact layer 1000 are solar absorber layer sections 1108a, 1108b and 1108c. Respectively disposed on solar absorber layer section 1108a, 1108b and 1108c are window layer sections 1110a, 1110b and 1110c. Solar absorber layer section 1108a, 1108b and 1108c and window layer sections 1110a, 1110b and 1110c are discussed with respect to FIG. 11.

Insulating section 1116a separates PV cell 1204 from PV cell 1206; insulating section 1116b separates PV cell 1206 from PV cell 1208. Insulating sections 1116a and 1116b may be formed by cutting or etching module 1200, and insulating sections 1116a and 1116b may be filled with an insulating material.

Top contact layer 1202 is disposed on window layer sections 1110a, 1110b and 1110c as well as insulating sections 1116a and 1116b. Top contact layer 1202 electrically connects the window layer of each PV cell, as required for each PV cell to be connected in a parallel electrical configuration. Top contact layer 1202 is at least partially transparent to light 110 to allow light 110 to reach the remainder of PV cells 1204, 1206 and 1208. Additionally, top contact layer 1202 is at least partially transparent to radio frequency electromagnetic radiation having the one or more predetermined frequencies. Furthermore, top contact layer 1202 must be electrically conductive so that it can collect electric charge. In an embodiment, top contact layer 1202 includes a plurality of top contact subsystems 700 of FIG. 7.

Encapsulation layer 1114 is applied to top contact layer 1202. Encapsulation layer 1114 is discussed with respect to FIG. 11.

With respect to the PV cells as discussed and described above, it is understood and appreciated that many different applications may present themselves where a radio frequency transparent photovoltaic cell or cells are advantageously desirable. For example, the operation of an RF transceiver within a building or vehicle having the above describe PV cells deployed on the roof or outer surface for energy production.

At least one specific application of PV cells is to power high altitude airships that remain in flight for a long period of time. Examples of such airships includes a radar airship, which locates objects, and a communication airship, which relays communication signals between stations. Because such airships do not frequently return to the ground for refueling, they must have one or more energy sources that will power them for a long duration of time. Although a large amount of one or more chemical energy sources, such as batteries or fossil fuels, could possibly power such airships for a sufficiently long duration of time, the volume and/or weight of such chemical energy sources makes their use impractical or impossible. Consequently, PV cells, which can potentially power airships indefinitely using solely sunlight as an energy source, are potentially an attractive energy source for airships.

Many airships, such as radar and communication airships, must transmit and/or receive radio frequency electromagnetic radiation. For example, a radar airship may detect an object by emitting radio frequency electromagnetic radiation, receiving returned radio frequency electromagnetic radiation reflected by the object, and analyzing a difference between the emitted and returned radio frequency electromagnetic radiation. As another example, a communication airship may receive data in the form of first microwave signals from a base station, and may forward this data to remote recipients in the form of second microwave signals.

The transfer and/or receipt of electromagnetic radiation requires an antenna to convert electrical signals to electromagnetic signals and vice versa. Consequently, airships that transmit and/or receive electromagnetic radiation, such as radar or communication airships, require at least one antenna.

An antenna may be placed on an airship's outer surface. An advantage of such placement is that the airship's structure does not shadow the antenna and thereby interfere with the antenna's transmission and/or reception of electromagnetic radiation. However, placement of the antenna on the airship's outer surface decreases the surface area available for placement of PV cells to power the airship. If an airship's electrical power requirements are great enough to require a significant portion of the airship's outer surface to be covered with PV cells, placing an antenna on the airship's outer surface may not be feasible.

Alternately, an antenna may potentially be placed inside an airship. Such practice may free surface area on the airship's outer surface for placement of PV cells. However, the antenna must be able to transmit and receive electromagnetic radiation through the airship's outer surface. Consequently, at least a portion of the airship's outer surface must be transparent to electromagnetic radiation in the frequencies of interest if the antenna is going to be placed within the airship.

Figure 13:
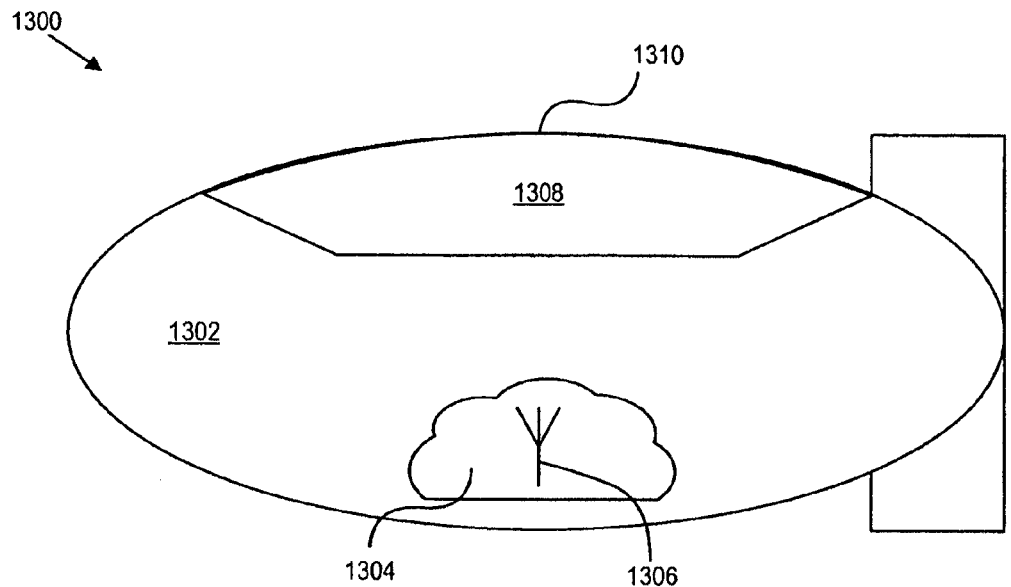
FIG. 13 is a side plan view of a prior art airship.

FIG. 13 is a side plan view of prior art airship 1300 having microwave frequency antenna 1306 located within interior 1304 of prior art airship 1300. Prior art airship 1300 includes prior art PV cell modules 1308 disposed on outer surface 1302. Outer surface 1302 is curved, therefore, prior art PV cell modules 1308 must be flexible. Because antenna 1306 must be able to transmit and/or receive radio frequency electromagnetic radiation through outer surface 1302, prior art PV cell modules 1308, which are opaque to radio frequency electromagnetic radiation, are located solely near top 1310 of prior art airship 1300 so that part of outer surface 1302 is at least partially transparent to radio frequency electromagnetic radiation.

Although prior art airship 1300 may be adequate for some airship applications, many modern airship applications require relatively large amounts of electrical power to power systems within the airship. Unfortunately, PV cells generally have relatively low efficiencies; consequently, a large surface area of PV cells is generally required to generate a large amount of electrical power. As discussed above, only a limited portion of outer surface 1302 of prior art airship 1300 may be covered with prior art PV cell modules 1308. Furthermore, because prior art PV cell modules 1308 are located solely near top 1310, prior art PV cell modules 1308 will only receive maximum sunlight (and be able to generate their maximum electric power) when the sun is over top of prior art airship 1300. Consequently, prior art airship 1300 may not be able to supply sufficient electric power to enable many modern airship applications that have an internal antenna and require a relatively large amount of electric power.

Because PV cells 100 are at least partially transparent to radio frequency electromagnetic radiation having one or more predetermined frequencies, PV cells 100 may cover a larger portion of an airship having an internal antenna (e.g., antenna 1306) than prior art PV cells. Consequently, PV cells 100 may be used to generate a larger amount of electric power on a airship than can be generated using prior art PV cells. Consequently, PV cells 100 may enable modern airship applications that have an internal antenna and require a relatively large amount of electric power.

Figure 14:
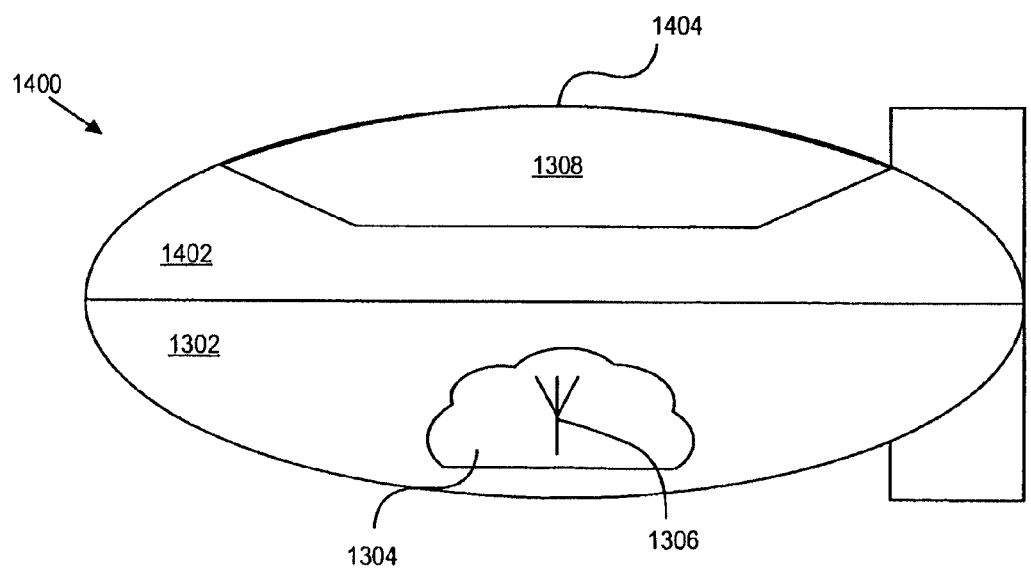
FIG. 14 is a side plan view of an airship having a plurality of radio frequency transparent PV cells, according to an embodiment.

FIG. 14 is a side plan view of airship 1400 having a plurality of radio frequency transparent PV cells 100 in PV cell modules 1402. As noted above, outer surface 1302 is curved, therefore, PV cell modules 1402 must be flexible. PV cell modules 1402 are tuned to be at least partially transparent to one or more predetermined frequencies of electromagnetic radiation generated and/or received by antenna 1306 located within interior 1304 of airship 1400. Because PV cell modules 1402 are at least partially transparent to electromagnetic radiation transmitted and/or received by antenna 1306, PV cell modules 1402 can cover a greater portion of surface 1302 than can prior art PV cell modules 1308.

FIG. 14 illustrates an embodiment wherein airship 1400 includes both radio frequency transparent PV cell modules 1402 and prior art PV cell modules 1308. In some embodiments, it may be desirable to use prior art (opaque) PV cell modules 1308 in addition to radio frequency transparent PV cell modules 1402 because prior art PV cell modules 1308 may have a higher efficiency than PV cell modules 1402. Prior art PV cell modules 1308 may be used in areas not requiring radio frequency transparency (such as near top 1404 of airship 1400), and PV cell modules 1402 may be used in areas requiring transparency to one or more predetermined frequencies of electromagnetic radiation.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A radio frequency transparent photovoltaic cell comprising:
   a back contact layer formed of an electrically conductive material;
   at least one first aperture formed only in the back contact layer and configured to pass signals of a first predetermined radio frequency band, each first aperture having a first footprint;
   at least one second aperture formed only in the back contact layer and configured to pass signals of a second predetermined radio frequency band, each second aperture having a second footprint, wherein the first footprint is larger than the second footprint; and
   at least one photovoltaic cell section disposed on the back contact layer.

2. The photovoltaic cell of claim 1, wherein said at least one second aperture is disposed between two said first apertures.

3. The photovoltaic cell of claim 1, wherein each first aperture and each second aperture have a cross shape.

4. The photovoltaic cell of claim 1, wherein about 90 percent of a surface area of the back contact layer is electrically conductive.

5. The photovoltaic cell of claim 1 further comprising: a substrate; and a plurality of photovoltaic cell sections disposed on the back contact layer opposite from the substrate.

6. The photovoltaic cell of claim 5, wherein at least one of the apertures partially delineates a plurality of photovoltaic cells.

7. The photovoltaic cell of claim 5, wherein at least two of the photovoltaic cell sections are electrically connected in a parallel configuration.

8. The photovoltaic cell of claim 5, wherein at least two of the photovoltaic cell sections are electrically connected in a series configuration.

9. The photovoltaic cell of claim 1, wherein the photovoltaic cell is disposed on an outer surface of an airship having one or more radio frequency antennas disposed in an interior of the airship.

10. The photovoltaic cell of claim 1, wherein a length (length) of the first footprint along a horizontal or vertical axis is approximated as a function of the first predetermined radio frequency (f) as follows:

$$\text{length} \approx \frac{3 \times 10^8}{2f} \text{meters.} \quad \text{(Eq. 3)}.$$

11. The photovoltaic cell of claim 1, wherein a length (length) of the second footprint along a horizontal or vertical axis is approximated as a function of the second predetermined radio frequency (f) as follows:

$$\text{length} \approx \frac{3 \times 10^8}{2f} \text{meters.} \quad \text{(Eq. 3)}.$$

* * * * *